Oct. 30, 1951 C. E. INGALLS 2,573,446
VOLTAGE GATE LIMITER
Filed April 11, 1946
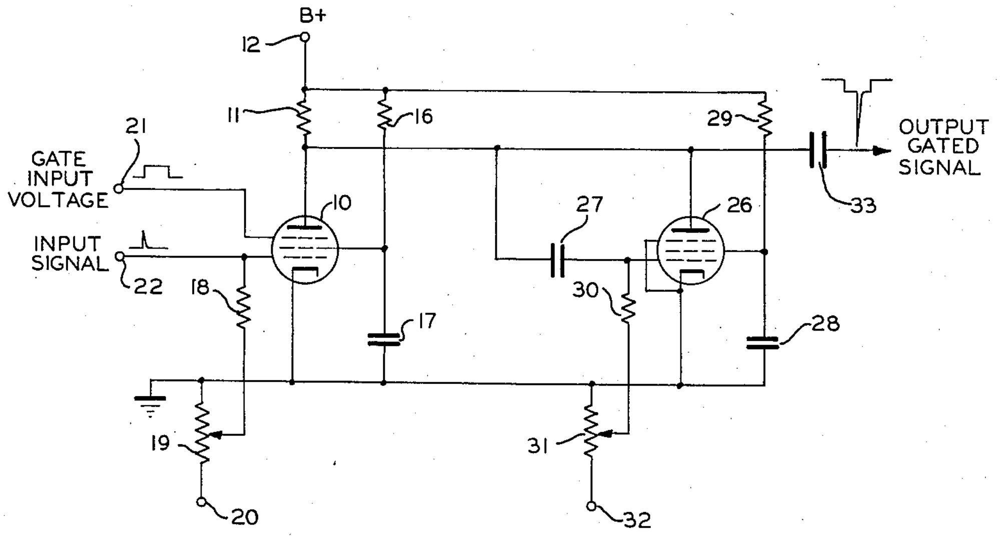
INVENTOR
CLYDE E. INGALLS
BY M. O. Hayes
ATTORNEY Patented Oct. 30, 1951

2,573,446

UNITED STATES PATENT OFFICE 2,573,446

VOLTAGE GATE LIMITER

Clyde E. Ingalls, Canisteo, N. Y., assignor, by mesne assignments, to the United States of America as represented by the Secretary of the Navy Application April 11, 1946, Serial No. 661,210

11 Claims. (Cl. 250—27)

This invention relates to electric circuits and more particularly to a circuit for limiting the amplitude of the gate voltage output of a gated video amplifier while fully amplifying the desired input signal applied during the gating period.

In connection with pulse radar system, it is often desired to permit reception and indication of video signals arriving at the receiver at or during a particular time and to exclude signals arriving at other times. This selection of signals is commonly accomplished in an amplifier stage which normally is cut off by a negative bias on some electrode and is turned on by changing the voltage on that electrode to allow the amplifier tube to conduct and amplify during the period of the desired signal. This process is called "gating" the tube on, since figuratively, the gate is opened for the desired signal to pass through the amplifier. The gating process causes a pulse of plate current in the amplifier which is detrimental in that it produces a pulse at the grid of the following amplifier stage which consumes a large portion of the amplification of the stage. Since the gate voltage produced by the gated tube is negative, this means that the following amplifier must be operated with high plate current in order that a portion of its amplification characteristic wave will be left for the desired signal. A tube of high heat dissipation is obviously undesirable.

The present invention provides a circuit which reduces or limits the gate voltage output of the gated tube while providing full amplification of the desired signal.

An object of this invention is to limit the amplitude of the gate voltage output of a gated amplifier.

A further object is to provide an amplifier circuit which is gated to amplify fully and linearly signals arriving at or during a predetermined period of time and which includes in its output only a limited amplitude gate voltage.

These and other objects and features of this invention will become apparent from the following detailed description when taken together with the accompanying drawing, which is a schematic circuit diagram of an embodiment of the invention.

Referring to the drawing, pentode tube 10 and its associated elements comprise the gated amplifier of this circuit. Positive plate potential for tube 10 is supplied through resistor 11 from terminal 12 (B+). Screen grid potential for tube 10 is supplied through resistor 16 from terminal 12 and the screen grid is by-passed to ground through capacitor 17. The cathode of tube 10 is grounded. The control grid of tube 10 is biased by its connection through resistor 18 to the slider arm of potentiometer 19 whose resistance element is connected between ground and a source of negative potential applied to terminal 20. The suppressor grid of tube 10 is connected to terminal 21 at which is applied a periodic positive gate input voltage pulse to turn on the tube. The positive input signals to be amplified by tube 10 are applied at terminal 22 which ties to the control grid of tube 10.

In previous cricuits employing gating tubes similar to tube 10, the gate voltage applied to the suppressor grid was sufficient only to turn the tube on slightly and thus, to provide a small plate current to keep the undesirable output gate pulse small. However, this resulted in operation of the gating tube on the curved part of the well known plate current versus grid voltage characteristic. It follows then that signal amplification provided by the gated tube was non-linear and that the incoming signal was distorted.

In the circuit of this invention pentode tube 26 allows gated tube 10 to be gated on at terminal 21 sufficiently to operate on the linear portion of its characteristic during the period of the incoming signal at terminal 22. The amplitude of the gate voltage applied at terminal 21 and the bias at the control grid of tube 10 taken from potentiometer 19 can be adjusted to place tube 10 on a linear portion of its plate current versus grid voltage characteristic. Thus when tube 10 is gated on, its plate voltage goes negative to its steady-state value and its plate current rises to a steady-state value.

The control grid of tube 26 is coupled to the plate of tube 10 through capacitor 27. The plates of tubes 10 and 26 are in parallel. The suppressor grid of tube 26 is tied to its cathode which is grounded. The screen grid of tube 26 is by-passed to ground through capacitor 28 and receives potential from terminal 12 through resistor 29. Tube 26 is made normally conducting by adjusting the bias at its control grid taken by connecting through resistor 30 to the slider arm of potentiometer 31 whose resistance element is connected between ground and a source of negative potential applied to terminal 32. The bias at the control grid of tube 26 is so adjusted that its steady-state plate current is slightly lower than the plate current of tube 10 when it is gated on.

The negative gate pulse which results at the plate of tube 10 upon application of the gate input voltage at its suppressor grid drives the grid of tube 26 down to cut-off. Thus the steady-state plate current of tube 10 supplants that of tube 26 through their common plate resistor 11. Since there is only a small change in current through common plate resistor 11, depending on the difference between the steady-state plate currents of tubes 10 and 26, the gate pulse voltage resulting at the plate junction of tubes 10 and 26 is likewise small. In other words, the negative gate output at the plate of tube 10 is inverted and opposed in phase by the output of tube 26. The outputs of tubes 10 and 26 are combined at their common plate junction and the resultant output gate is the reduced amplitude gate desired and is coupled from the circuit through capacitor 33. The input signal applied at the control grid of tube 10 from terminal 22 is fully amplified by tube 10 and superimposed on the combined reduced amplitude gate output. The amplified signal from the plate of tube 10 is unaffected by the feedback action of tube 26 since tube 26 is cut off by the gate voltage amplitude during the period of the incoming signal.

Thus, the circuit described limits the gate voltage output of a gated amplifier while providing full amplification of a desired input signal. The circuit, of course, illustrates only a certain specific embodiment of this invention, the many possible modifications of which will be readily apparent to those skilled in the art. Therefore, this invention is not to be limited except insofar as is necessitated by the prior art and the spirit and scope of the appended claims.

What is claimed is:

1. A gate voltage amplitude limiting circuit comprising a first normally nonconducting amplifier, responsive to a gate voltage pulse for amplifying an input signal applied thereto, a second amplifier normally conducting and connected to receive the output of said first amplifier, said second amplifier being biased to be cut off by a small amplitude of the gate voltage output of said first amplifier, and means for combining the outputs of said first and second amplifiers, whereby said combined outputs of said first and second amplifiers is a gate voltage of small amplitude with an amplified superimposed signal corresponding to said input signal.

2. A circuit for limiting the amplitude of a gating pulse comprising, an electron tube having at least an anode and a suppressor grid, said tube being biased to conduct only during application of a positive gating pulse to the suppressor grid thereof, and means coupled to the anode of said tube and responsive to the amplified gating pulse appearing thereat for producing a phase opposed gating pulse of reduced amplitude and combining said first opposed gating pulse with said amplified gating pulse whereby an effective gating pulse of reduced amplitude results.

3. A circuit comprising, a first electron tube amplifier having at least an anode, a control grid and a suppressor grid, said first tube being normally nonconducting and operative during the application of a gating pulse to the suppressor grid thereof to amplify an input signal applied to the control grid thereof, a second electron tube amplifier having at least an anode and a control grid, said second tube being normally conducting and having its control grid capacitively coupled to the anode of said first tube, said second tube being biased so as to be rendered nonconducting by a small amplitude gating pulse output from said first amplifier and means for combining the outputs of said first and second amplifiers whereby a gating pulse of small amplitude having superimposed thereon an amplified signal corresponding to said input signal results.

4. A circuit comprising a first electron tube amplifier having at least an anode, a suppressor grid, and a control grid, means for applying a positive gating pulse to the suppressor grid of said first tube, means for applying a positive input signal to the control grid of said tube, said first tube being biased to conduct only upon application of said gating pulse, a second electron tube having at least an anode and a control grid and being normally conducting, means including a common anode resistance connecting the anodes of said first and second tubes to the positive terminal of a source of potential, and capacitive coupling means connecting the anode of said first tube and the control grid of said second tube whereby the negative gating pulse appearing at the anode of said first tube is coupled to the control grid of said second tube thereby rendering said second tube nonconducting before said input signal is acted upon by said first amplifier and producing at the anode of said first tube a negative gating pulse of small amplitude having superimposed thereon an amplified negative signal corresponding to said input signal.

5. A circuit comprising first and second electron tubes each having at least an anode, a control grid, and a suppressor grid, means including a common anode resistor coupling the anodes of said first and second tubes to the positive terminals of a source of potential, a capacitor coupling the anode of said first tube and the control grid of said second tube, means for biasing said first tube such that it conducts only during the application of a positive gating pulse to the suppressor grid thereof, said second tube being normally conducting and biased to be cut off upon the application to the control grid thereof of a small amplitude gating pulse from the anode of said first tube, the combined outputs of said first and second tubes being a gating pulse of small amplitude.

6. The circuit of claim 5 and means for applying a positive input signal to the control grid of said first tube during the application thereto of said gating pulse, the combined outputs of said first and second tubes being a gating pulse of small amplitude having an amplified input signal superimposed thereon.

7. The circuit of claim 5 and means for applying a positive input signal to the control grid of said first tube after said second tube has been cut off, whereby the combined output of said first and second tubes is a negative gating pulse of small amplitude having an amplified negative superimposed signal corresponding to said input signal.

8. A circuit comprising, first and second pentode amplifiers each having at least an anode, a control grid, and a suppressor grid, means including a common anode resistance connecting the anodes of said pentodes to the positive terminal of a source of potential, means for biasing said first amplifier to be normally nonconducting and to have a steady state anode current on the linear portion of its anode current-grid voltage characteristic during the application of a positive gating pulse to its suppressor grid, means for biasing said second amplifier to be normally conducting with a steady state anode current slightly less than the steady state anode current of said first pentode, and means capacitively coupling the anode of said first pentode and the contrc' grid of said second pentode.

9. The circuit of claim 8 and means for applying a positive input signal to the control grid of said first pentode during the application of said gating pulse.

10. A system for limiting the amplitude of the gating pulse output of a gated pentode amplifier while linearly amplifying an input signal applied to said amplifier during the application of a gating pulse comprising, means for biasing said pentode amplifier to operate on the linear portion of its plate current grid voltage characteristic during the application of said gating pulse, means responsive to the gating pulse output of said amplifier for producing a gating pulse of polarity opposite to said gating pulse output, and means for combining the output of said amplifier and said gating pulse of opposite polarity whereby an effective gating pulse of reduced amplitude having a superimposed amplified input signal results.

11. A system for limiting the amplitude of the gating pulse output of a gated amplifier while fully amplifying an input signal applied to said amplifier during the application of said gating pulse comprising, means responsive to said gating pulse output for producing a gating pulse of opposite polarity, and means for combining said gating pulse of opposite polarity and the output of said amplifier whereby an effective gating pulse of reduced amplitude having a superimposed amplified input signal results.

CLYDE E. INGALLS.

REFERENCES CITED

The following references are of record in the file of this patent:

UNITED STATES PATENTS

| Number | Name | Date |
|---|---|---|
| 2,217,957 | Lewis | Oct. 15, 1940 |
| 2,419,548 | Grieg | Apr. 29, 1947 |